United States Patent [19]
Wright

[11] Patent Number: 4,902,925
[45] Date of Patent: Feb. 20, 1990

[54] REFLECTIONLESS TRANSDUCER

[75] Inventor: Peter V. Wright, Dallas, Tex.

[73] Assignee: R.F. Monolithics, Inc., Dallas, Tex.

[21] Appl. No.: 178,271

[22] Filed: Mar. 15, 1988

Related U.S. Application Data

[63] Continuation of Ser. No. 891,237, Jul. 29, 1982, abandoned.

[51] Int. Cl.$^4$ ............................................. H01L 41/08
[52] U.S. Cl. ................................. 310/313 B; 333/194
[58] Field of Search ................ 310/313; 333/150–156, 333/193–196

[56] References Cited

U.S. PATENT DOCUMENTS

| | | | |
|---|---|---|---|
| 3,401,360 | 9/1968 | Bois | 310/313 B X |
| 3,801,937 | 4/1974 | Bristol | 310/313 B |
| 3,870,975 | 3/1975 | Vasile | 310/313 B |
| 3,908,137 | 9/1975 | Hunsinger et al. | 310/313 B |
| 4,075,582 | 2/1978 | Walker | 310/313 D |
| 4,353,046 | 10/1982 | Hartmann | 333/194 |
| 4,429,246 | 1/1984 | Miyajama | 310/313 B |
| 4,464,597 | 8/1984 | Setsune | 310/313 B |
| 4,516,094 | 5/1985 | Lee | 310/313 D |

FOREIGN PATENT DOCUMENTS 0003446  1/1979  Japan ................. 310/313 B Primary Examiner—Mark O. Budd
Attorney, Agent, or Firm—Michael A. O'Neil

[57] ABSTRACT

A reflectionless surface acoustic wave transducer is proposed which has first and second opposed conductive transducer pads on a substrate of piezo-electric material. A plurality of groups of n interdigitated λ/4 electrodes extend from the opposed pads to form an elongated transducer. Each group of n interdigitated electrodes has a spacing within the group of λ/4 and the spaces between adjacent groups of the interdigitated electrodes are λ/2 such that adjacent groups cancel reflections from each other thereby establishing a reflectionless surface acoustic wave transducer.

22 Claims, 4 Drawing Sheets

REFLECTIONLESS TRANSDUCER

CROSS REFERENCE TO RELATED APPLICATIONS

This application is a continuation of application Ser. No. 891,237, filed July 29, 1982, now abandoned.

BACKGROUND OF THE INVENTION

The present invention relates to a substantially reflectionless transducer structure for surface acoustic wave devices and in particular to a single level surface acoustic wave transducer having quarter wave length electrodes which substantially eliminates electrode reflections and which can be easily made unidirectional.

Surface acoustic wave devices known as SAW devices have many uses in the UHF and VHF frequency ranges. SAW devices have been especially useful as impedance elements, resonators, and band pass filters in these frequency ranges. Typical SAW devices have a substrate with at least a surface layer of piezo-electric material and surface acoustic wave transducers in interdigitated form disposed on the piezo-electric surface. The transducers convert an electrical signal to surface acoustic waves propagating on the piezoelectric surface. Several problems are associated with prior art $\lambda/4$ surface acoustic wave transducers. One of the problems occurs because the transducer electrodes cause internal reflections which distort the transducer output and the shape of the input conductance. Another problem occurs when the transducer is used in filter applications. Triple transit distortion is caused by regeneration reflections in the transducers.

The first problem, distortion caused by internal reflections, is solved in the prior art by the use of structures having 3 or 4 electrodes per wavelength to cancel the internal reflections and provide a symmetrical input conductance wave shape. However, the increased number of electrodes per wavelength limits the frequency of operation of the structure due to photolithographic constraints.

In order to eliminate triple transit distortion, three-phase and single-phase devices are used to form unidirectional transducers. Again, the size of the electrodes becomes a limiting factor in the construction of the device and thereby limits the frequency of operation of the device.

The present invention proposes a simple single level interdigitated SAW transducer having $\lambda/4$ electrodes in which reflections are canceled and therefore allow a structure to be built at twice the frequency of those presently available. The device has an undistorted output and a symmetric input conductance, can be placed on standard crystal cuts and can be made into single-phase unidirectional transducer as a two level structure in a simple manner. Further the single-phase transducer can be made with a flat input susceptance and symmetric input conductance for use as impedance elements.

Thus all electrodes in the transducer are $\lambda/4$ and the gaps between electrodes in the transducer are $\lambda/4$ or $\lambda/2$. The electrodes of the transducer are on a fixed grid for relatively easy construction.

Electrode reflections in the transducer are completely canceled by destructive interference on a local basis. Reflections of each electrode in the transducer are canceled by the reflections of a neighboring electrode a distance of $\lambda/2$ away or a multiple thereof. The transducer utilizes a plurality of groups of interdigitated $\lambda/4$ electrodes extending from opposed transducer pads to form an elongated transducer. Each group of the interdigitated electrodes has a spacing within the group of $\lambda/4$ and the spaces between the adjacent groups of the interdigitated electrodes are $\lambda/2$. With this construction, adjacent groups cancel reflections from each other. The groups can consist of any number of electrodes, n, where n is equal or greater than two. Thus electrode groups may consist of two, three, four or more electrodes per group.

In addition the structures can be made unidirectional by mass loading of alternate groups. Further, if the mass loading of the alternate groups is reversed, the sense of the unidirectionality also changes.

The frequency response of the two electrodes per group device includes group type responses which are 40% above and below the pass band. While this is a disadvantage, the responses are sufficiently far removed from the pass band for most filtering applications. Also, as the number of electrodes per group increases, the group type responses move closer to the pass band. This allows coupled resonators and filters to be constructed with one transducer having a first number of electrodes n per grouping and a second transducer to be constructed of an electrode grouping having a different number of electrodes thereby allowing good communication between the transducers in the pass band but poor communication between the transducers out of the pass band.

Further, by adding an additional interdigitated electrode in alternate ones of said groups of n electrodes a weakly unidirectional transducer is obtained Thus it is an object of the present invention to provide a single level surface acoustic wave transducer which eliminates electrode reflections.

It is also an object of the present invention to provide a surface acoustic wave device having $\lambda/4$ electrodes which eliminate electrode reflections and can easily be made unidirectional with a flat input susceptance and a symmetrical input conductance.

It is yet another object of the present invention to provide a surface acoustic wave device having $\lambda/4$ electrodes on a standard crystal cut which eliminates electrode reflections, has a symmetric input conductance and an undistorted output.

It is still another objection of the present invention to provide a surface acoustic wave transducer having a plurality of groups of n interdigitated $\lambda/4$ electrodes extending from opposed conductive pads with each group of the interdigitated electrodes having a spacing within the group of $\lambda/4$ and the spaces between adjacent groups having a spacing of $\lambda/2$ for maximum coupling between the electrodes and the substrate.

It is still another object of the present invention to provide either an impedance element or a single port resonator with a transducer formed of $\lambda/4$ electrodes.

SUMMARY OF THE INVENTION

Thus the present invention relates to a substantially reflectionless surface acoustic wave transducer comprising a substrate means having at least a surface layer of piezo-electric material on which acoustic waves may be propagated, defining first and second opposed conductive transducer pads on said substrate, a plurality of groups of n interdigitated $\lambda/4$ electrodes extending from the opposed pads to form an 20 elongated transducer, each group of the interdigitated electrodes having a spacing within the group of λ/4 and the spaces between adjacent groups of the interdigitated electrodes being λ/2 such that adjacent groups cancel reflections from each other.

The invention also relates to a method of forming a substantially reflectionless surface acoustic wave transducer comprising the steps of preparing a substrate having at least a surface layer of piezo-electric material on which acoustic waves may be propagated, defining first and second opposed conductive transducer pads on the substrate, extending a plurality of groups of n interdigitated λ/4 electrodes from the opposed pads to form an elongated transducer, spacing the electrodes within each group of interdigitated electrodes by λ/4 and spacing adjacent groups of the interdigitated electrodes with a spacing of λ/2 such that adjacent groups cancel reflections from each other.

BRIEF DESCRIPTION OF THE INVENTION

These and other objects of the present invention will be more readily understood in conjunction with the accompanying drawings in which like numbers represent like elements and in which.

Figure 3:
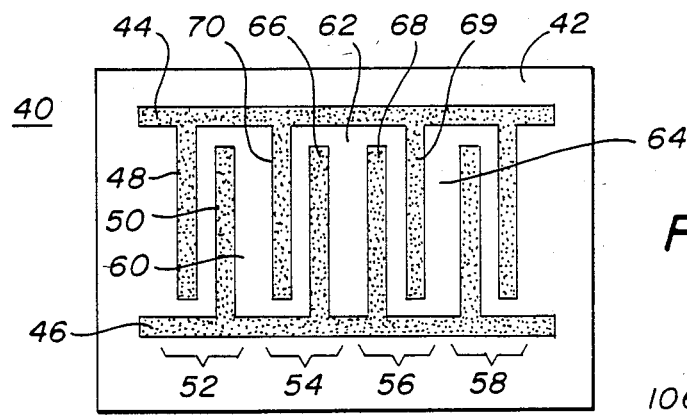
FIG. 3 is a diagrammatic representation of the novel unweighted surface acoustic wave transducer of the present invention which has single level λ/4 interdigitated electrodes but which completely cancels electrode reflections within the transducer.
Figure 6:
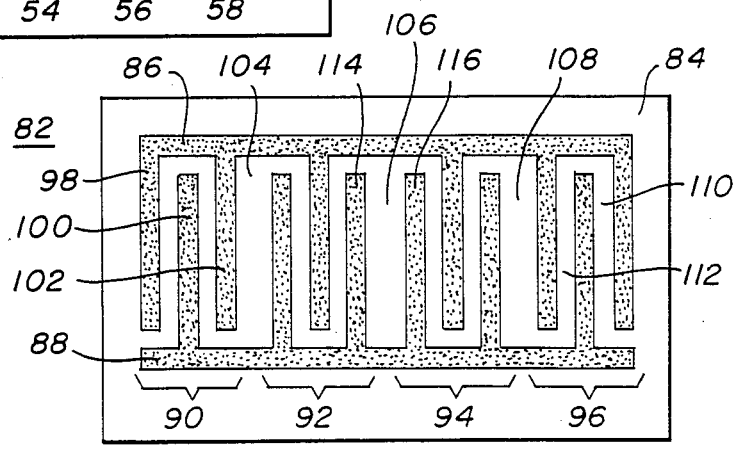
Figure 4:
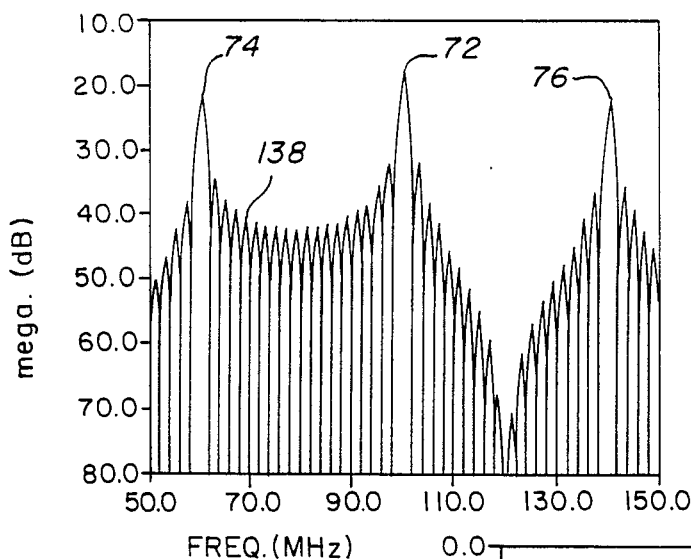
Figure 5:
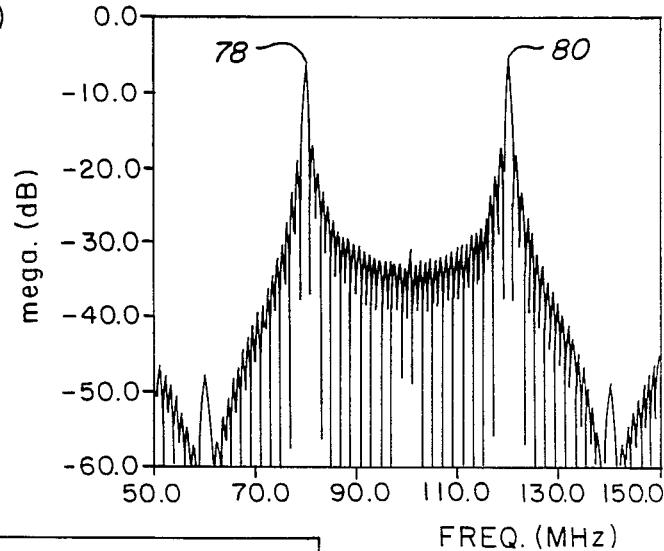
Figure 7:
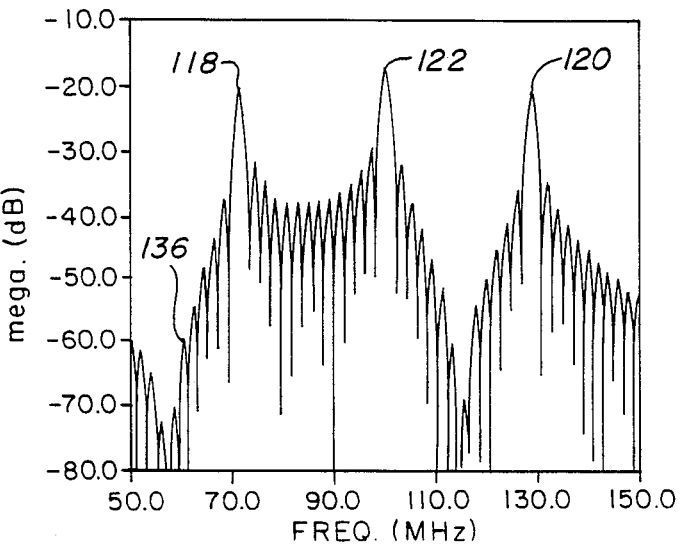
Figure 8:
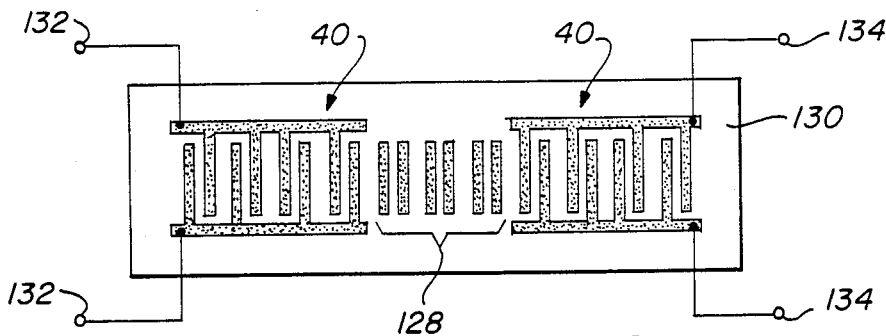
Figure 9:
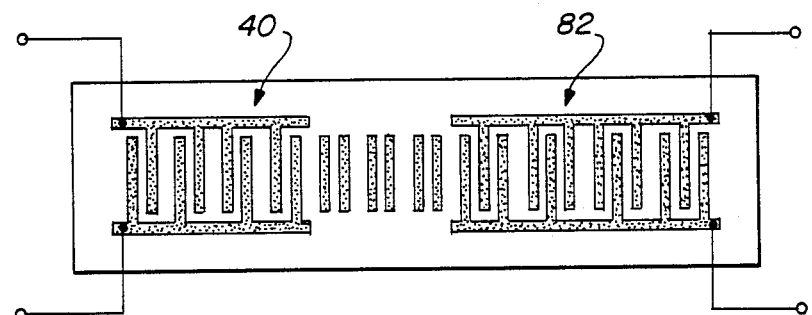
Figure 10:
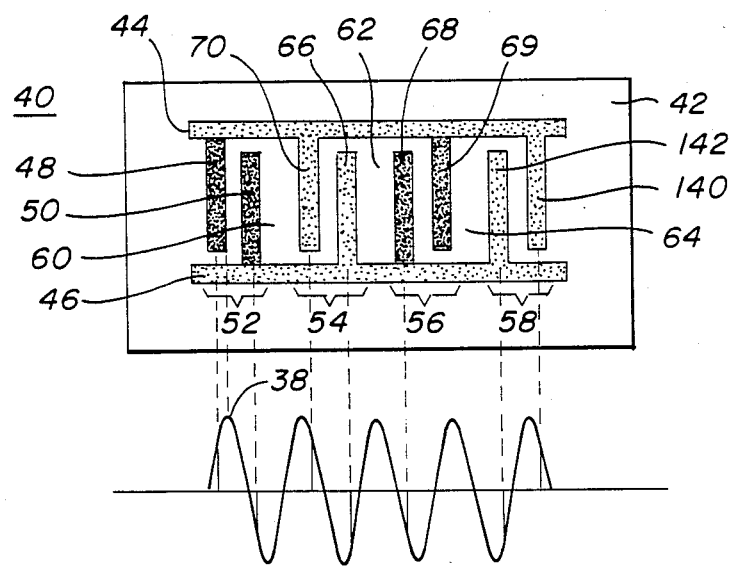
Figure 11:
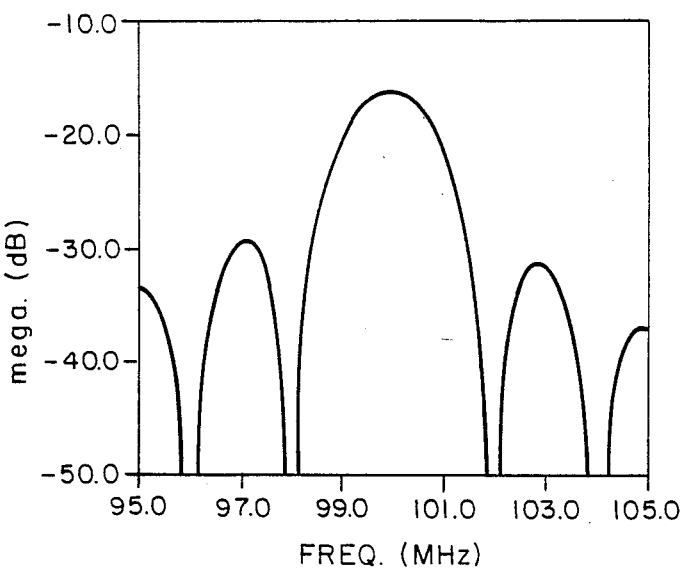
Figure 12:
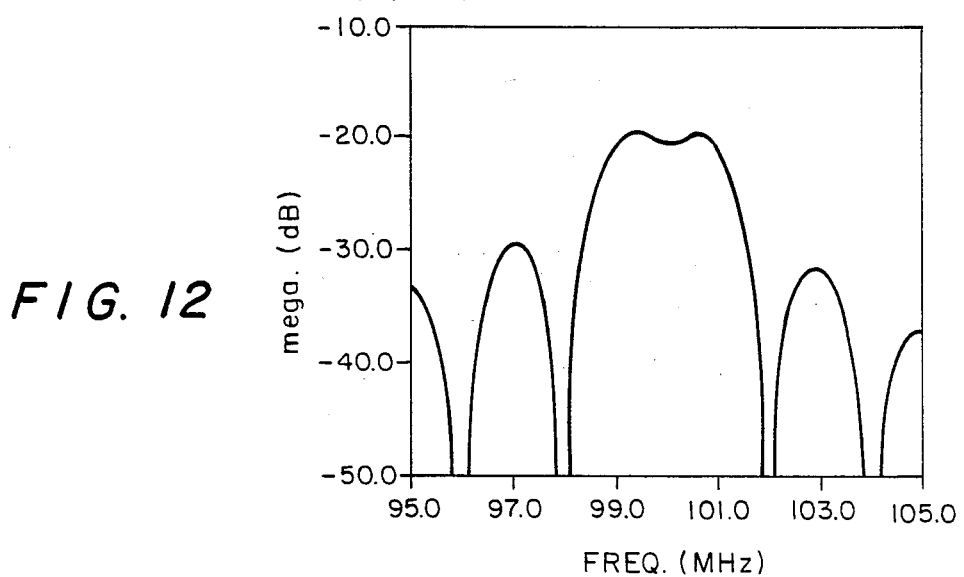
Figure 13:
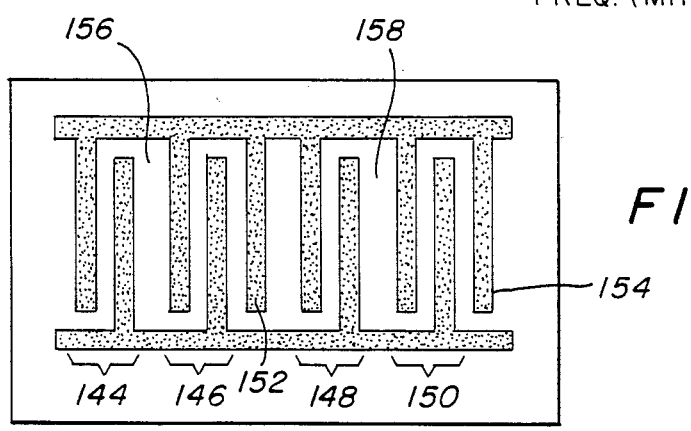

FIG. 4 a graph of the broad band frequency response for the transducer of FIG. 3 indicating out of band spurious "group type" responses;

FIG. 5 is a graph illustrating the acoustic reflection coefficient on the transducer of FIG. 3 under short circuit conditions and indicating the extremely small reflection coefficient across the pass band;

FIG. 6 is a diagrammatic representation of the novel unweighted transducer of the present invention having three electrodes per group;

FIG. 7 is a graph showing the frequency response of the novel transducer of FIG. 6 indicating that group type responses for this transducer are closer in to the pass band than with the transducer of FIG. 3;

FIG. 8 is a diagramatic representation of a filter formed utilizing the transducers of the present invention;

FIG. 9 is a diagramatic representation of a two-port resonator filter formed with first and second transducers of the present invention which have different groupings of interdigitated electrodes to suppress out-of-band group responses;

FIG. 10 is a diagramatic representation of a novel transducer of the present invention which is made unidirectional by mass loading alternate groups of the interdigitated electrodes;

FIG. 11 a graph of the frequency response on the forward acoustic port of the unidirectional transducer illustrated in FIG. 10;

FIG. 12 is a graph of the frequency response of the reverse acoustic port of the novel transducer illustrated in FIG. 10 showing that the center frequency transmission response from the reverse port is less than the transmission response on the forward port thus indicating substantial unidirectionality of the device; and FIG. 13 is an alternate version of the unweighted device in which an additional interdigitated electrode has been added in alternate ones of the groups of n electrodes to form a weakly unidirectional transducer.

DETAILED DESCRIPTION OF THE DRAWINGS

Figure 1:
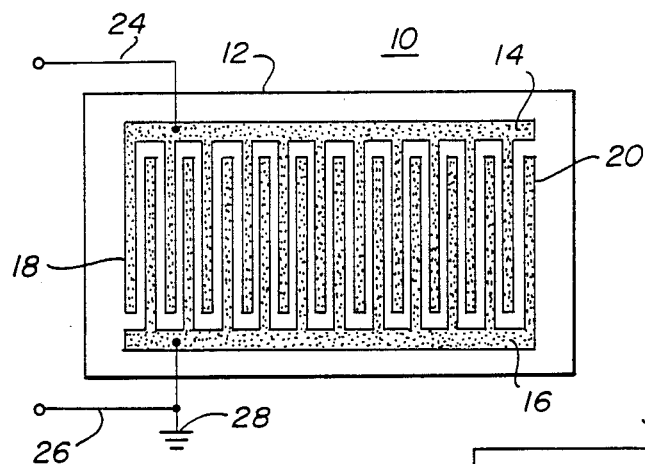
FIG. 1 is a diagramatic representation of a prior art surface acoustic wave transducer having interdigitated λ/4 electrodes which create internal reflections in the transducer.

FIG. 1 illustrates a typical prior art transducer element which can be used to form various surface acoustic wave devices. The transducer element 10 comprises substrate 12 having at least a surface layer of piezo-electric material thereon through which acoustic waves may be propagated. Opposed conductive transducer pads 14 and 16 are defined on the substrate 12 in a well known manner and include a plurality of interdigitated surface acoustic wave electrodes 18 and 20 extending from the opposed pads 14 and 16 respectively and forming an elongated transducer. Leads 24 and 26 are connected to conductive transducer pads 14 and 16 respectively as input and output terminals. One of the transducer pads, such as conductive pad 16, may be grounded as at 28. The number of interdigitated electrodes 18 and 20 may, of course, vary but a large number of them are used under normal conditions to form transducer 10. Only a few of the electrodes 18 and 20 are shown in FIG. 1 for purposes of simplicity of the drawings The electrodes 18 and 20 have a width of λ/4 and are spaced by λ/4 and the device has two electrodes per wave length.

The prior art transducer of FIG. 1 tends to reflect acoustic signals between electrodes. These internal reflections distort the response of the transducer.

Because of these internal reflections, the transducer output is distorted and the shape of its input conductance is distorted. Thus, the use of the device is limited because of these distortions. In order to overcome the distortions, the prior art transducers are formed with three or four electrodes per wavelengths. By constructing the transducer in this manner, the reflections are canceled thus allowing a transducer to be constructed with an undistorted output and an undistorted input conductance. However, another problem is created since the greater the number of electrodes per wavelength, the smaller in size the electrodes and, thus, frequency of operation of the device is limited.

Further, if the structure of FIG. 1 is used in a filter application, triple transit distortion occurs and the transducers must be severely mismatched to reduce the distortion, resulting in a high insertion loss. To eliminate triple transit distortion, the prior art utilizes unidirectional transducers formed as single-phase or three-phase devices as is well-known.

Figure 2:
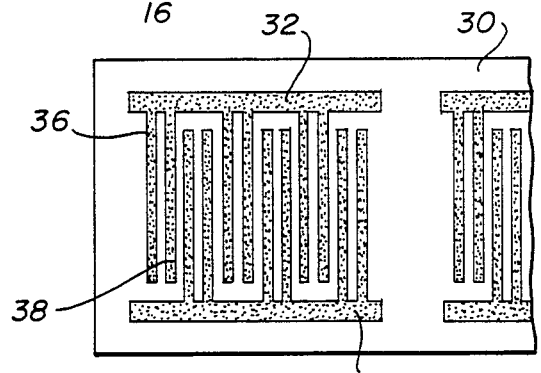
FIG. 2 is a diagramatic representation of a prior art surface acoustic wave transducer being constructed with split finger electrodes in order to eliminate reflections and thereby having electrode widths of λ/8.

Such a prior art single-phase unidirectional transducer can be seen in FIG. 2. It is a split electrode transducer constructed with a piezoelectric substrate 30 on which transducer pads 32 and 34 are disposed and which have electrodes 36 and 38 forming an electrode pair extending in interdigitated form from each of the conductor pads 32 and 34. Such a conventional split finger electrode transducer is commonly considered to have no net internal reflections as is well known in the art because the reflected waves from one electrode 36 and its nearest neighbor 38 are 180° out of phase and cancel because of the λ/8 width of the electrodes and the spaces between them. The finger and gap widths of a transducer as shown in FIG. 2 with split finger construction are oneeighth of the operating acoustic wave length thus limiting the frequency range of the device by photolithographic constraints to a maximum frequency of operation of around 600 MHz when compared to a 1200 MHz range for the simplest form of SAW transducer shown in FIG. 1 and described earlier.

Thus the structure with split finger construction does eliminate internal reflections but has frequency constraint problems. The device can be made unidirectional by mass loading alternate electrodes as set forth in U.S. Pat. No. 4,353,046 thereby enabling the device to be used in applications such as filters where triple transit distortion must be eliminated.

FIG. 3 is a diagramatic representation of the novel unweighted surface acoustic wave transducer of the present invention which is substantially reflectionless and which utilizes quarter wave length construction of the electrodes and which can easily be made unidirectional. The transducer 40 as shown in FIG. 3 comprises a substrate 42 having at least a layer of piezo-electric material on which acoustic waves may be propagated. First and second opposed conductive transducer pads 44 and 46 are defined on the substrate 42. A plurality of groups 52, 54, 56 and 58 of n interdigitated $\lambda/4$ electrodes 48 and 50 extend from the opposed pads 44 and 46 to form an elongated transducer 40. For simplicity of the drawings, only four groups of electrodes are shown in FIG. 3. In this case, as shown in FIG. 3, two electrodes, such as 48 and 50, equal the n interdigitated $\lambda/4$ electrodes in each of the groups 52, 54, 56 and 58. It will be noted that each of the groups 52, 54, 56 and 58 of interdigitated electrodes have a spacing within the group of $\lambda/4$ and, for an unweighted transducer, with maximum coupling, the spaces 60, 62 and 64 between adjacent groups of said interdigitated electrodes have a spacing of $\lambda/2$. It will also be noted that for an unweighted transducer, with maximum coupling, every alternate $\lambda/2$ space, such as space 62, is formed by two adjacent electrodes 66 and 68 extending from a common transducer pad such as pad 46. Such construction causes adjacent groups such as 52 and 54 or 56 and 58 to cancel reflections from each other thus creating a substantially reflectionless transducer 40.

Thus, summarizing, all of the electrodes in the unweighted transducer are $\lambda/4$ wide and the gaps or spacing within each group are $\lambda/4$ while the spaces between adjacent groups of interdigitated electrodes are spaced $\lambda/2$. In addition, in order to maximize the coupling between the electrodes to the transducer acoustic wave, every alternate $\lambda/2$ space between unweighted groups is formed by two adjacent electrodes extending from a common transducer pad. If other electrodes are added to change the operation of the transducer, the spacing of the electrodes must stay the same but the electrodes will be coupled to one or the other of the transducer pads as necessary to achieve maximum coupling. Thus, with the transducer shown in FIG. 3, electrode reflections are completely canceled by destructive interference on a local basis. Reflections of each electrode in the transducer are canceled by the reflections of neighboring electrode $\lambda/2$ (or a multiple distance thereof) away. Thus electrode group 52 of FIG. 3 cancels the reflections of the electrodes in group 54 while the electrodes of group 56 cancel the reflections of the electrodes in group 58. The electrodes in other groups (not shown) would operate in a similar manner to cancel the reflections from each other. This means that the transducer output is undistorted and the shape of the input conductance is undistorted. In addition, the device can be constructed to operate at a maximum frequency because of the $\lambda/4$ electrode construction.

Because of the non-uniform sampling by the non-periodic placement of the electrodes, the transducer 40 has undesired out-of-band spurious "group-type" responses. These are illustrated in FIG. 4 which shows the broad band frequency response for a prototype filter formed with structure of the type shown in FIG. 3 on a YZ-LiNbO3 substrate. It will be noted that the group type responses 74 and 76 in FIG. 4 are 40% above and below the pass band indicated at 72. This is sufficiently far removed from the pass band for most filtering applications.

FIG. 5 illustrates the acoustic reflection coefficient on the transducer 40 of FIG. 3 under short circuit conditions. As can be seen, the reflection coefficient is extremely small across the pass band. The greatest reflections occur at points 78 and 80 which are out of the pass band.

Other sampling configurations can be employed if desired. For instance, in FIG. 6, there is a disclosed schematically a representation of an unweighted transducer 82 with electrode groupings 90, 92, 94 and 96 of three electrodes each. Again, each of the electrodes is constructed with a $\lambda/4$ width and are separated by spaces within the group such as space 110 and 112 which are $\lambda/4$ in width for maximum coupling. It will be noted that the spaces 104, 106 and 108, which are the spaces between the adjacent groups of the interdigitated electrodes have a spacing of $\lambda/2$. Again, in this embodiment the reflections generated by one group of electrodes are canceled by the reflections generated by an adjacent group of electrodes. For instance, the reflections generated by electrode group 90 are canceled by the reflections of the electrodes in group 92. In like manner the reflections in electrode group 94 are canceled by the reflections of electrode group 96. These cancellations occur because, as stated earlier, of the $\lambda/2$ spacing, or multiples thereof, between electrodes of one group and the electrodes of an adjacent group and the $\lambda/4$ construction of the electrodes and of the spacing between adjacent electrodes within a group.

The frequency response for the structure of FIG. 6 on a substrate of LiNbO3 is shown in FIG. 7. Note that the group type out-of-band responses 118 and 120 for this structure are closer to the pass band at point 122 than with the preferred implementation shown in FIG. 4. As will be explained hereinafter with relation to FIGS. 9 and 10, different sampling schemes can be employed with two transducers in a SAW filter configuration or a coupled resonator configuration to effectively suppress the out-of-band spurious responses at peaks 118 and 120 in FIG. 7 and peaks 74 and 76 in FIG. 4.

FIG. 8 illustrates a filter which can be constructed of the resonators shown in FIG. 3. Thus the two transducer structures 40 are placed on a substrate 130 in spaced relationship with appropriate gratings 128. Thus a filter of conventional construction is utilized with the two novel structures 40. Input terminals are shown at 132 and output terminals at 134.

As stated earlier, one of the ways in which the out-of-band spurious responses can be effectively suppressed is to couple the transducer in FIG. 3 having two electrodes per group to a transducer having a different number of electrodes per group such as the transducer in FIG. 6 having three electrodes per group. Such resonator filter structure is shown in FIG. 9. When these two structures 40 and 82 communicate with each other, the center peaks 72 and 122, (in FIG. 4 and FIG. 7) the pass band frequency and the point of lowest reflections, are at the same frequency and thus the signals pass freely between the transducers 40 and 82. However, the out-of-band spurious responses 74, 118, 76, and 120 all occur at different frequencies and thus it is difficult for the two transducers to effectively couple these signals from one to the other in the out-of-band region since when the spurious response of one transducer is at a peak, for instance 74, the spurious response of the other is at a null, such as at peak 136 in FIG. 7. In like manner, when transducer 82 in FIG. 6 has a maximum out-of-band spurious response at 118, transducer 40 in FIG. 3 has a null as indicated approximately at point 138 in FIG. 4. Thus the two transducers do not effectively communicate with each other except at the pass band frequency which, of course, is what is desired.

A further advantage of the transducer of the present invention is that, with an additional second-level metalization, the structure can be made unidirectional. The unidirectional nature of this configuration can be understood by reference to the transduced electric field pattern shown under the transducer 40 in FIG. 10. It will be noted that the peak of transduction for each electrode occurs at the edge of the electrode. For instance peak 138 occurs at the right edge of electrode 48. As is well known in the art, when the centers of transduction are positioned $\lambda/8$ or 45° from the effective center of reflection the introduction of internal reflections will result in unidirectional behavior, as explained in U.S. Pat. No. 4,353,046. Thus in this configuration shown in FIG. 10, the locations of the electrodes correspond precisely to those locations at which the introduction of internal reflections will result in unidirectional behavior. In this structure, unweighted electrodes of one group cancel the reflections of the adjacent group. Thus, in order to introduce the necessary internal reflections for unidirectional behavior, additional mass loading is added to every alternate pair of electrodes as shown, for example, by electrodes 48 and 50 and electrodes 68 and 69. The reflections introduced by this mass loading will be located at the center of each mass loaded electrode thus causing the transducer to be unidirectional for the reasons set forth in U.S. Pat. No. 4,353,046. It is also extremely easy with this transducer configuration to reverse the sense of unidirectionality. This can be accomplished simply by adding the additional mass loading to the other alternate pairs of electrodes such as electrodes 70 and 66 and 140 and 142 instead of 48 and 50 and 68 and 69 as those shown in FIG. 10.

FIG. 11 shows the frequency response of the transducer of FIG. 10 on the forward acoustic port in an embodiment wherein the transducer is fixed on quartz. For comparison, the frequency response on the reverse acoustic port is shown in FIG. 12. Thus the frequency response on the reverse port is approximately 5DB less than that on the forward port. The structure is thus seen to be substantially unidirectional.

Thus, the structures of FIGS. 8 and 9, can be weighted or mass loaded to cause the transducers to be unidirectional towards each other by mass loading appropriated ones of the alternate groups of electrodes.

FIG. 13 illustrates another embodiment of the present invention which is weakly unidirectional in the configuration shown. Thus electrode pair 144 cancels the reflections of electrode pair 146 because of the $\lambda/2$ spacing 156. In addition, electrode pair 148 cancels the reflections from electrode pair 150 because of the $\lambda/2$ spacing 158. However, added electrodes 152 and 154 produce reflections which are not canceled and thus the device is weakly unidirectional.

Thus there has been disclosed a transducer configuration which is an important reflectionless transducer which can be easily made into a unidirectional transducer structure in its own right. It has important advantages over the conventional single phase unidirectional transducer configuration. Since all of the electrodes and gaps are a minimum of $\lambda/4$, compared to $\lambda/8$ in the conventional configuration, these devices can be fabricated at higher frequencies. They have a symmetric input conductance and an undistorted output. They can be made unidirectional by mass loading alternate electrodes. In addition, $\lambda/4$ electrodes have greater reflectivity which is a problem encountered in conventional single-phase unidirectional transducers. These transducers can be expected to find applications whereafter a low loss transducer technology is required. They will be very useful for filtering for band widths in the one percent to five percent range. The maximum useful band width is limited only by the maximum internal distributed reflectivity that can be achieved This will be particularly useful for low loss filter applications at high frequencies such as cellular radio which is in the 800–900 MHz range. At these frequencies, the available alternative low loss technology, such as the threephase transducer or the split finger transducer, becomes extremely difficult to fabricate. Further these unidirectional transducers can be fabricated on quartz, $LiNbO_3$ or on any other type of substrate. Also, the number of electrodes, n per group, may be any practical number where n is equal to or greater than 2.

While the invention has been described in connection with a preferred embodiment, it is not intended to limit the scope of the invention to the particular form set forth, but, on the contrary, it is intended to cover such alternatives, modifications and equivalents as may be included in the spirit and scope of the invention as defined by the appended claims.

I claim:

1. A reflectionless surface acoustic wave transducer comprising:
   a. a substrate means having at least a surface layer of piezo-electric material on which surface acoustic waves may be propagated,
   b. first and second opposed conductive transducer pads defined on said substrate,
   c. a plurality of groups of n interdigitated $\lambda/4$ electrodes extending from opposed conductive pads to form an elongated transducer, and
   d. each group of said interdigitated electrodes having a spacing from each electrode to adjacent electrodes within the group of substantially $\lambda/4$ and the spaces between adjacent groups of said interdigitated electrodes being substantially $\lambda/2$, such that adjacent groups cancel reflections from each other.

2. A transducer as in claim 1 wherein said n electrodes in each of said groups comprises two interdigitated electrodes, one extending from each transducer pad.

3. A transducer as in claim 1 wherein said n electrodes in each of said groups comprises three interdigitated electrodes, two extending from one transducer pad and separated by a third electrode extending from the other transducer pad.

4. An impedance element comprising:
   a. the transducer of claim 1, and
   b. electrical input and output leads operatively coupled to said transducer.

5. A single port resonator comprising:
   a. the transducer of claim 1, and
   b. electrical input and output leads operatively coupled to said transducer.

6. A transducer as in claim 1 further comprising means for mass loading alternate ones of said groups of electrodes to obtain substantially unidirectional wave propagation in said substrate.

7. In a surface acoustic wave resonator filter of the type having input and output spaced aligned transducers and a grating structure interposed between said input and output transducers and being resonant at the same frequency as said input and output transducers, the improvement comprising:
   a. one of said input and output transducers being the transducer of claim 2 and the other of said input and output transducers being the transducer of claim 3,
   b. means for mass loading alternate ones of said electrode groups of the transducer of claim 2 to cause substantial unidirectional wave propagation in the direction of said transducer of claim 3, and
   c. means for mass loading alternate ones of said electrode groups of the transducer of claim 3 to cause substantial unidirectional wave propagation in the direction of said transducer of claim 2 whereby a filter is obtained with suppression of out-of-band responses.

8. In a surface acoustic wave resonator of the type having input and output spaced aligned transducers, the improvement comprising:
   a. one of said input and output transducers being the transducer of claim 2 and the other of said input and output transducers being the transducer of claim 3,
   b. means for mass loading alternate ones of said electrode groups of the transducer of claim 2 to cause substantial unidirectional wave propagation in the direction of said transducer of claim 3, and
   c. means for mass loading alternate ones of said electrode groups of the transducer of claim 3 to cause substantial unidirectional wave propagation in the direction of said transducer of claim 2 whereby a resonator is obtained with suppression of out-of-band responses.

9. A transducer as in claim 1 further comprising an additional interdigitated electrode in alternate ones of said groups of n electrodes thereby forming a weakly unidirectional transducer.

10. A method of cancelling reflections from adjacent groups of interdigitated electrodes extending from opposed conductive transducer pads in a surface acoustic wave transducer comprising the steps of:
    connecting a plurality of groups of N interdigitated $\lambda/4$ electrodes to the opposed pads where $N \geq 2$, adjacent ones of the electrodes in each group extending from different ones of the two pads to form an elongated transducer,
    spacing adjacent ones of the electrodes within each of the groups a distance of substantially $\lambda/4$, and
    spacing adjacent groups of the electrodes by a distance of substantially $\lambda/2$, or a multiple thereof so that adjacent groups cancel reflections from each other.

11. A method as in claim 10 wherein each of said groups in n electrodes is formed with two electrodes, one extending from each transducer pad.

12. A method as in claim 10 each of said groups of n electrodes is formed with three electrodes, two extending from one transducer pad and separated by a third electrode extending from the other transducer pad.

13. A method as in claim 10 wherein alternate ones of said groups of electrodes are mass loaded to obtain substantial unidirectional wave propagation in said substrates.

14. A method as in claim 10 wherein an additional interdigitated electrode is added in alternate ones of said groups of n electrodes thereby forming a weakly unidirectional transducer.

15. A method as in claim 15 wherein every alternate $\lambda/2$ space is formed by two adjacent electrodes extending from a common transducer pad.

16. A method of cancelling reflections in a surface acoustic wave transducer impedance element having at least a surface layer of piezoelectric material on which surface acoustic waves may be propagated comprising the steps of:
    forming opposed conductive transducer pads on the substrate,
    connecting a plurality of groups of N interdigitated $\lambda/4$ electrodes to the opposed pads where $N \geq 2$, adjacent ones of the electrodes in each group extending from different ones of the first and second opposed pads to form an elongated transducer.
    spacing adjacent ones of the electrodes within each of the groups a distance of substantially $\lambda/4$,
    spacing adjacent groups of the electrodes by a distance of substantially $\lambda/2$ or a multiple thereof so that adjacent groups cancel reflections from each other, and
    operatively coupling input and output electrical leads to the opposed pads.

17. A method as in claim 16 wherein every alternate $\lambda/2$ space is formed by two adjacent electrodes extending from a common transducer pad.

18. A method of cancelling reflections in a surface acoustic wave transducer single port resonator having at least a surface layer of piezoelectric material on which surface acoustic waves may be propagated comprising the steps of:
    forming opposed conductive transducer pads on a substrate,
    connecting a plurality of groups of N interdigitated $\lambda/4$ electrodes to the opposed pads where $N \geq /2$, adjacent ones of the electrodes in each group extending from different ones of the first and second opposed pads to form an elongated transducer,
    spacing adjacent ones of the electrodes within each of the groups a distance of substantially $\lambda/4$,
    spacing adjacent groups of the electrodes by a distance of substantially $\lambda/2$ or a multiple thereof so that adjacent groups cancel reflections from each other, and
    operatively coupling input and output electrode leads to the opposed pads.

19. A method as in claim 18 wherein every alternate $\lambda/2$ space is formed by two adjacent electrodes extending from a common transducer pad.

20. A method of forming a reflectionless surface acoustic wave transducer for placement on a substrate having at least a surface layer of piezo-electric material on which surface acoustic waves may be propagated comprising the step of defining first and second opposed conductive transducer pads having a plurality of groups of n interdigitated $\lambda/4$ electrodes extending from said opposed pads to form an elongated transducer, and having spacings formed within each group of electrodes of $\lambda/4$ and spaces between adjacent groups of said interdigitated electrodes of $\lambda/2$ such that adjacent groups cancel reflections from each other.

21. A method of cancelling reflections in a surface acoustic wave resonator filter having input and output spaced transducers on a substrate comprising the steps of:
   a. forming a first one of the input and output transducers with a plurality of groups of two $\lambda/4$ interdigitated electrodes per group and having an electrode spacing within each group of $\gamma/4$ and a spacing between groups of $\gamma/2$,
   b. forming the other of the input and output transducers with a plurality of groups of three $\lambda/4$ interdigitated electrodes per group and having an electrode spacing within each group of $\gamma/4$ and a spacing between groups of $\gamma/2$,
   c. mass loading alternate ones of the groups of electrodes of the first transducer to cause substantial unidirectional wave propagation in the direction of the other transducer, and
   d. mass loading alternate ones of the groups of electrodes of the other transducer to cause substantial wave propagation in the direction of the first transducer to obtain a filter having supression of out-of-band responses.

22. A method of cancelling reflections in a surface acoustic wave resonator having input and output spaced transducers on a substrate comprising the steps of:
   a. forming a first one of the input and output transducers with a plurality of groups of two $\lambda/4$ interdigitated electrodes per group and having an electrode spacing within each group of $\gamma/4$ and spacing between groups of $\gamma/2$,
   b. forming the other of the input and output transducers with a plurality of groups of three $\lambda/4$ interdigitated electrodes per group and having an electrode spacing within each group of $\gamma/4$ and a spacing between groups of $\gamma/2$,
   c. mass loading alternate ones of the groups of electrodes of the first transducer to cause substantial unidirectional wave propagation in the direction of the other transducer, and
   d. mass loading alternate ones of the groups of electrodes of the other transducer to cause substantial wave propagation in the direction of the first transducer to obtain a resonator with suppression of out-of-band responses.

* * * * *

UNITED STATES PATENT OFFICE
CERTIFICATE OF CORRECTION

Patent No. 4,902,925     Dated Feb. 20, 1990

Inventor(s) Peter V. Wright

It is certified that error appears in the above-identified patent and that said Letters Patent is hereby corrected as shown below:

ON TITLE PAGE: Second column last line change "22 claim" to read --21 claims--.

Column 2, line 67, cancel "20";

Column 3, line 37, insert --is--;

Column 5, line 2, cancel "oneeighth" and substitute therefor --one-eighth--; and Column 8, line 31, cancel "threephase" and substitute therefor --three-phase--.

Column 11 and 12, claims 21 & 22 should be renumbered 20 and 21.

Claim 15, cancel "15" appearing after the word "claim" and substitute therefor --10--; and Claim 20, cancel the entire claim.

Signed and Sealed this

Thirteenth Day of October, 1992

Attest:

DOUGLAS B. COMER

Attesting Officer     Acting Commissioner of Patents and Trademarks